(12) United States Patent
Choi

(10) Patent No.: US 6,635,138 B1
(45) Date of Patent: Oct. 21, 2003

(54) METHOD OF IMMOBILIZING CIRCUITRY FINGERS

(75) Inventor: Jin-O Choi, Getsville, NY (US)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/368,967

(22) Filed: Aug. 5, 1999

Related U.S. Application Data

(63) Continuation-in-part of application No. 08/832,638, filed on Apr. 4, 1997, now abandoned.

(51) Int. Cl.[7] .................. B32B 31/10; B32B 7/12; C09J 7/02; B05D 5/10; H01L 21/603
(52) U.S. Cl. .......... 156/230; 156/240; 156/247; 156/277; 156/289; 427/146; 427/147; 427/148; 427/208.6; 427/96; 428/40.1; 428/41.8; 428/42.1; 428/202; 428/343; 428/347; 428/352; 428/914; 438/118
(58) Field of Search .................. 156/230, 235, 156/297, 240, 247, 277, 289; 428/202, 352, 40.1, 41.8, 42.1, 42.3, 343, 347, 914; 438/118, 464; 427/208.6, 146, 147, 148, 96

(56) References Cited

U.S. PATENT DOCUMENTS

| | | | | |
|---|---|---|---|---|
| 5,049,434 A | * | 9/1991 | Wasulko | 428/202 |
| 5,221,642 A | * | 6/1993 | Burns | 156/233 |
| 5,554,684 A | * | 9/1996 | Choi et al. | 524/588 |
| 5,872,398 A | * | 2/1999 | King et al. | 257/735 |

OTHER PUBLICATIONS

Handbook of Adhesives, Skeist, 3rd Edition, 1990, pp. 698–704.*

* cited by examiner

*Primary Examiner*—J. A. Lorengo
(74) *Attorney, Agent, or Firm*—Baker & McKenzie

(57) ABSTRACT

Disclosed is a method of immobilizing the fingers of circuitry. A coating is formed of a liquid adhesive on the surface of a release film in a pattern of strips in positions perpendicular to and across the positions the fingers of the circuitry will have when the pattern of adhesive is bonded to it. The coating is rendered non-tacky and is bonded across and between the fingers and the release film is removed from the coating.

23 Claims, 1 Drawing Sheet

METHOD OF IMMOBILIZING CIRCUITRY FINGERS

CROSS-REFERENCE TO RELATED APPLICATION

This application is a continuation-in-part of application Ser. No. 08/832,638, filed Apr. 4, 1997, by Jin-O Choi, titled, "METHOD OF BONDING INTEGRATED CIRCUIT CHIPS TO CIRCUITRY," now abandoned.

BACKGROUND OF THE INVENTION

This invention relates to a method of immobilizing circuitry fingers and bonding the circuitry to an IC chip. In particular, it relates to forming a coating of a liquid adhesive on the surface of a release film in a pattern of strips, rendering the coating non-tacky, bonding the strips of coating on the release film across the fingers of circuitry, removing the release film from the coating, and bonding an integrated circuit (IC) chip to the coating.

In manufacturing microelectronic components, silicon wafers are made that contain large numbers of IC chips. The wafers are cut and the individual chips are bonded to lead frames which enable wires to be attached to the chips. Alternatively, a cluster of chips can be bonded to a matching cluster of lead frames. After epoxy molding, the assembly is cut into individual packages of chips and lead frames.

The lead frames are stamped out of thin metal and consist of a multiplicity of delicate fingers attached to supports. The fingers are eventually cut, but during the cutting or mounting of the chips and other devices to the lead frames, the fingers can be bent at various angles or otherwise damaged, resulting in a poor bond.

SUMMARY OF THE INVENTION

I have found that by applying an adhesive coating over and between circuitry fingers, the fingers can be immobilized and fixed in position. The fingers are then much more resistant to damage during cutting or the mounting of chips or other devices to the circuitry.

DESCRIPTION OF THE PREFERRED EMBODIMENT

Figure 1:
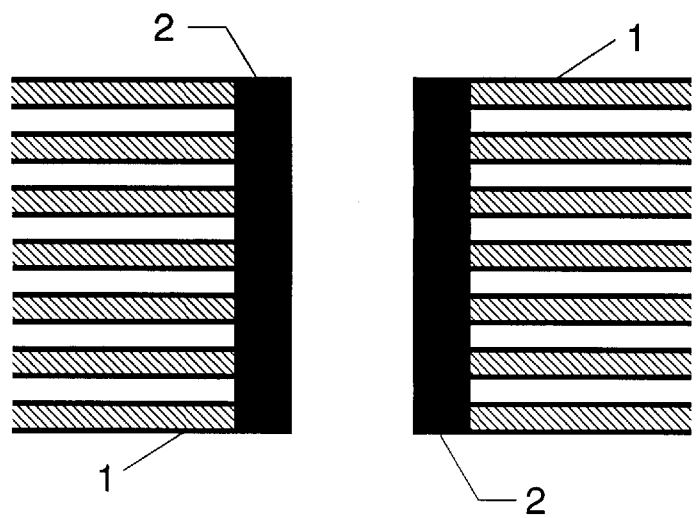
FIG. 1 is a plan view illustrating the application of adhesive to the fingers of circuitry according to the method of this invention.
Figure 2:
FIG. 2 is a side view partially in section through FIG. 1.
Figure 3:
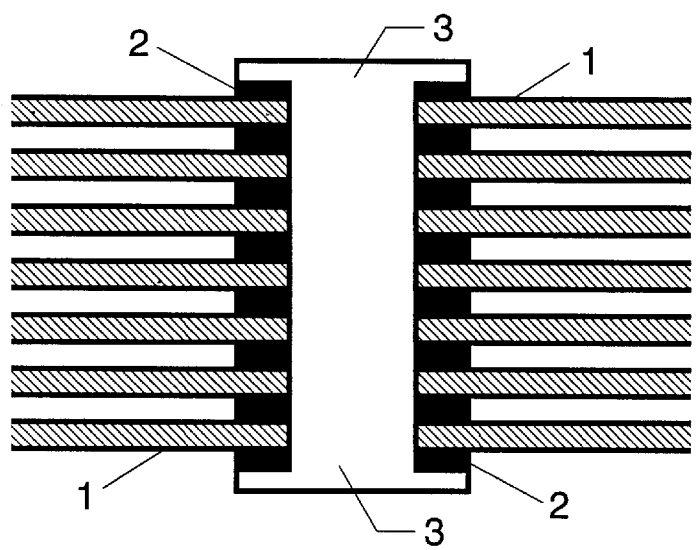
FIG. 3 is a plan view showing the attachment of the fingers shown in FIG. 1 to an IC chip.
Figure 4:
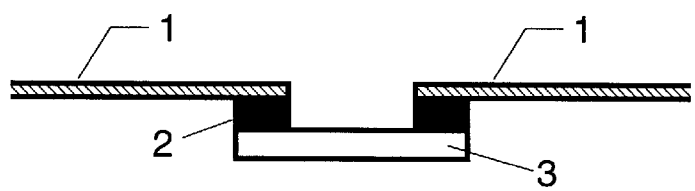
FIG. 4 is a side view partially in section of FIG. 3.

In FIGS. 1 and 2, a metal lead frame (not shown) has a multiplicity of metal fingers 1. Placed over a group of fingers 1 is a strip of insulating adhesive 2, which immobilizes fingers 1 and fixes them in place. In FIGS. 3 and 4, adhesive 2 is bonded to IC chip 3.

Any non-conductive adhesive composition suitable for binding IC chips to circuitry can be used in the process of this invention. The adhesive can be either thermoplastic or thermoset. The adhesive is a liquid which can be either a liquid resin, such as an epoxy, or a solid resin, such as a polyamic acid, dissolved or partially dissolved in a solvent. Examples of particular resins that can be used include epoxies, polyimides, polyamides, polyamic-acids, polyamide-imides, acrylic polymers, and partially imidized or ester-blocked polyamic-acids or polyamide-imides. Particularly preferred are epoxies, polyamides, polyimides, polyamic-acids, polyamide-imides, polyamic-acids or polyamide-imides, and these resins mixed with a metal oxide or silica. Examples of organic solvents that can be used include N-methyl pyrrolidone (NMP), dimethylacetamide (DMAC), and dimethylformamide (DMF).

Screen or stencil printable adhesives are preferred as it is easier to form patterns that match the positions of the fingers using those types of compositions. U.S. Pat. No. 5,554,684, herein incorporated by reference, discloses screen printable adhesives that are particularly preferred. Those adhesives are solutions of polyamic acids in an organic solvent, where about 10 to about 90% of the amic acid groups have been imidized and the solution has a solids content of about 20 to about 60 wt %. A paste suitable for screen printing is formed by mixing the solution with about 0.1 to about 10 wt % (based on the weight of the paste), of a thixotropic agent such as fumed silica.

A polyamic-acid can be formed by reacting a diamine with a dianhydride. The polyamic-acid can later be cured to form a polyimide. If part of the diamine contains siloxane groups, a polyimidesiloxane is formed. Any dianhydride or combination of dianhydrides can be used as the dianhydride monomer in forming the polyamic-acid, although aromatic dianhydrides are preferred as they give superior properties. Examples of suitable dianhydrides include:

1,2,5,6-naphthalene tetracarboxylic dianhydride;
1,4,5,8-naphthalene tetracarboxylic dianhydride;
2,3,6,7-naphthalene tetracarboxylic dianhydride;
2-(3',4'-dicarboxyphenyl) 5,6-dicarboxybenzimidazole dianhydride;
2-(3',4'-dicarboxyphenyl) 5,6-dicarboxybenzoxazole dianhydride;
2-(3',4'-dicarboxyphenyl) 5,6-dicarboxybenzothiazole dianhydride;
2,2', 3,3'-benzophenone tetracarboxylic dianhydride;
2,3,3',4'-benzophenone tetracarboxylic dianhydride;
3,3',4,4'-benzophenone tetracarboxylic dianhydride (BTDA);
2,2',3,3'-biphenyl tetracarboxylic dianhydride;
2,3,3',4'-biphenyl tetracarboxylic dianhydride;
3,3',4,4'-biphenyl tetracarboxylic dianhydride (BPDA); bicyclo-[2,2,2]-octen-(7)-2,3,5,6-tetracarboxylic-2,3,5,6-dianhydride; thio-diphthalic anhydride; bis(3,4-dicarboxyphenyl) sulfone dianhydride; bis(3,4-dicarboxyphenyl) sulfoxide dianhydride; bis(3,4-dicarboxyphenyl oxadiazole-1,3,4) paraphenylene dianhydride; bis(3,4-dicarboxyphenyl) 2,5-oxadiazole 1,3,4-dianhydride; bis[2,5-(3',4'-dicarboxydiphenylether)] 1,3,4-oxadiazole dianhydride; bis(3,4-dicarboxyphenyl) ether dianhydride or 4,4'-oxydiphthalic anhydride (ODPA); bis(3,4-dicarboxyphenyl) thioether dianhydride;
bisphenol A dianhydride;
bisphenol S dianhydride;
2,2-bis(3,4-dicarboxyphenyl) hexafluoropropane dianhydride or 5,5-[2,2,2-trifluoro-1-(trifluoromethyl) ethylidene]bis-1,3-isobenzofurandione) (6FDA);
hydroquinone bisether dianhydride;
bis (3,4-dicarboxyphenyl) methane dianhydride;
cyclopentadienyl tetracarboxylic acid dianhydride;
cyclopentane tetracarboxylic dianhydride;
ethylene tetracarboxylic acid dianhydride;
perylene 3,4,9,10-tetracarboxylic dianhydride;
pyromellitic dianhydride (PMDA);

tetrahydrofuran tetracarboxylic dianhydride; and
resorcinol dianhydride.

The preferred dianhydrides are ODPA, BPDA, BTDA, 6FDA, and PMDA or mixtures thereof, as these dianhydrides are readily available and have been found to give superior properties. The dianhydrides can be used in their tetraacid form or as mono, di, tri, or tetra esters of the tetra acid, but the dianhydride form is preferred because it is more reactive.

DIAMINE MONOMER

An aromatic non-siloxane containing diamine should be used to prepare the polyamic-acid as those diamines give the best properties. Examples of suitable diamines include:
m-phenylenediamine (MPD);
p-phenylenediamine (PDA);
2,5-dimethyl-1,4-phenylenediamine;
2,4-diaminotoluene (TDA);
2,5-and 2,6-diaminotoluene;
p-and m-xylenediamine;
4,4'-diaminobiphenyl;
4,4'-diaminodiphenyl ether or 4,4'-oxydianiline (ODA);
4,4'-diaminobenzophenone;
3,3',3,4', or 4,4'-diaminophenyl sulfone or m,m-, m,p-, or p,p-sulfone dianiline;
4,4'-diaminodiphenyl sulfide;
3,3'or 4,4'-diaminodiphenylmethane or m,m-or p,p-methylenedianiline;
3,3'-dimethylbenzidine;
α,α'-bis(4-aminophenyl)-1,4-diisopropyl benzene or 4,4'-isopropylidenedianiline or bisaniline p; α,α'-bis(4-aminophenyl)-1,3-diisopropyl benzene or 3,3'-isopropylidonedianiline or bisaniline m;
1,4-bis(p-aminophenoxy)benzene; 1,3-bis(p-aminophenoxy)benzene; 4,4'-bis(4-aminophenoxy) biphenyl; 1,3-bis(3-aminophenoxy)benzene (APB); 2,4-diamine-5-chlorotoluene;
2,4-diamine-6-chlorotoluene;
2,2-bis(4 [4-aminophenoxy]phenyl)propane (BAPP);
trifluoromethyl-2,4-diaminobenzene;
trifluoromethyl-3,5-diaminobenzene;
2,2'-bis(4-aminophenyl)-hexafluoropropane (6F diamine);
2,2'-bis(4-phenoxy aniline) isopropylidene;
2,4,6-trimethyl-1,3-diaminobenzene;
4,4'-diamino-2,2'-trifluoromethyl diphenyloxide;
3,3'-diamino-5,5'-trifluoromethyl diphenyloxide;
4,4'-trifluoromethyl-2,2'-diaminobiphenyl;
2,4,6-trimethyl-1,3-diaminobenzene;
diaminoanthraquinone;
4,4'-oxybis[2-trifluoromethyl)benzeneamine] (1,2,4-OBABTF);
4,4'-oxybis[3-trifluoromethyl)benzeneamine];
4,4'-thiobis[(2-trifluoromethyl)benzeneamine];
4,4'-thiobis[(3-trifluoromethyl)benzeneamine];
4,4'-sulfoxylbis[(2-trifluoromethyl)benzeneamine];
4,4'-sulfoxylbis[(3-trifluoromethyl)benzeneamine];
4,4'-ketobis[(2-trifluoromethyl)benzeneamine];
4,4'-[(2,2,2-trifluoromethyl-1-(trifluoromethyl)-ethylidine) bis(3-trifluoromethyl)benzeneamine].

The preferred aromatic diamines are ODA, TDA, APB and BAPP, or a combination of these, due to their excellent properties.

SILOXANE MONOMER

A polyimidesiloxane can be prepared by using as part of the monomer about 1to about 80 mole percent, based on total dianhydride or diamine monomer, of a dianhydride or diamine monomer that contains siloxane groups. The siloxane-containing monomers can be either aromatic or non-aromatic, but non-aromatic monomers are preferred as they are more readily available. The siloxane-containing monomer is preferably a diamine. Examples of siloxane diamines that can be used include compounds having the formula

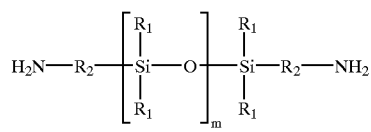

Examples of siloxane dianhydrides that can be used include compounds having the formula

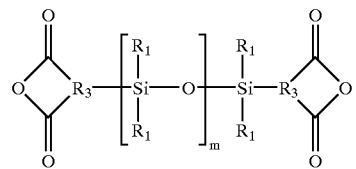

where $R_1$, $R_2$, and $R_3$ are mono, di, and triradicals, respectively, each independently selected from a substituted or unsubstituted 1 to 12 carbon atom aliphatic group or a substituted or unsubstituted 6 to 10 carbon atom aromatic group. Examples of monoradicals include —$CH_3$, —$CF_3$, —$CH=CH_2$, —$(CH_2)_n$,$CF_3$, —$C_6H_5$, —$CF_2$—$CHF$—$CF_3$, and

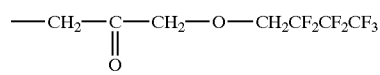

Examples of diradicals include —$(CH_2)_n$—, —$(CH_2)_n$—, —$CF_2$—, and —$C_6H_4$—. Examples of triradicals include =$CH$—$CH_2$—,

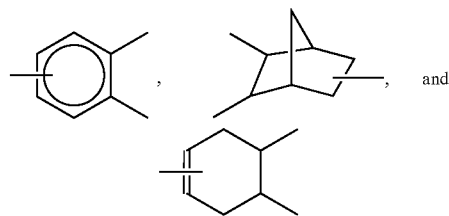

where "n" is 1 to 10 and "m" is 1 to 200, but is preferably 1 to 12. (Siloxane diamines are herein denoted by the notation "$G_m$".)

THE ADHESIVE

The adhesive is first applied to the surface on a release film. Examples of release films that can be used for this surface include polyethylene, polypropylene, polytetrafluoroethylene, and polyethylene terepthalate. These release films are preferably coated with a release agent, such as a silicone, a fluorinated polymer, or an aliphatic resin, to further prevent the adhesive from adhering to the release film.

The adhesive can be applied to the release film by, for example, spin coating, screen (stencil) printing, dispensing through a needle or template, the use of a doctor blade, or other suitable means. Since circuitry units and IC chips are normally manufactured as clusters of about 2 to about 100 individual units and chips, which are later separated into individual circuitry units and chips, it is preferable to deposit the adhesive coating on the release film in a pattern that will match the pattern of the chips. Even if individual chips are to be coated, it is still often desirable to form the adhesive in a pattern so that it will be applied only across the fingers and possibly to other portions of the circuitry. The formation of the adhesive in a pattern can be accomplished by forcing it through a template having apertures that are in the desired locations, such as a tube or needle (syringe), a screen, or a stencil; screen (stencil) printing and dispensing with a syringe are particularly desirable methods of forming a pattern. The adhesive can be applied to the free-standing fingers, but preferably a sheet of a releasable material, such as polyethylene terephthalate, is placed under the fingers during application of the adhesive.

If a solvent is present in the adhesive composition, sufficient solvent should be evaporated from the adhesive after it is applied to the release film to make the adhesive non-tacky. This can typically be accomplished by increasing the Tg to above room temperature. For solutions of polyamic-acids, this will typically mean the evaporation of about 80 to about 90 wt % of the solvent. If the adhesive does not contain a solvent, it can be rendered non-tacky by B-staging or partial curing. After the adhesive has been rendered non-tacky, the resulting coating is preferably about 30 to about 200 microns in thickness.

Since the coated release film is often not used immediately but is shipped and stored for long periods of time, it is desirable to protect it by placing a releasable sheet, such as a sheet of polyethylene, polypropylene, or polyethylene terepthalate, over it. This sheet is removed immediately before the adhesive is to be applied to the circuitry. This protective release sheet also prevents evaporation of solvent during storage.

The coated release film is aligned with a circuitry unit or cluster of circuitry units and the adhesive is pressed and heated against the circuitry so as to effect its bonding to the fingers of the circuitry. A temperature of about 80 to about 150° C. is suitable for most semiconductor adhesives. A pressure of about 6.8 to about 340 kPa (about 1 to about 50 psi) can be used. The adhesive can coat the surface of the fingers of the circuitry and it should also be forced into spaces between the fingers. After bonding, the release film is removed from the coating.

Before the chips are attached to the adhesive on the circuitry, it is desirable to hard bake the adhesive so as to remove as much solvent as possible and reduce the amount of heating of the chips. Almost all of the solvent in the adhesive is preferably removed so that less than 0.5 wt % solvent remains. Hard baking for most semiconductor adhesives can be accomplished at about 200 to about 400° C.

In mounting the chips to the circuitry, the chips or clusters of chips are first aligned with the circuitry so that the pattern of the adhesive is in the proper position. The chips are pressed against the circuitry at a temperature above the Tg for thermoplastics and, for thermosets, high enough so that a small amount of flow occurs.

The process of this invention is applicable to various forms of circuitry including, for example, lead frames, flexible circuits, and printed circuit boards (PCB). Lead frames, are typically made of metal such as copper, alloy 42, or palladium. The invention can be applied to either a chip-on-lead process (COL), where the chip is mounted on top of the lead frame, or to a lead-on-chip process (LOC), where the lead frame is mounted on top of the chip.

The following examples further illustrate this invention.

EXAMPLE 1

To a 500 mL 3-necked flask equipped with a mechanical stirrer, a reflux condenser, and a thermometer, 48.2 g (0.155 mol) of 4,4'-oxydiphthalic anhydride and 11 g of 1,3-bis(3-aminopropyl) terminated polydimethylsiloxane were dissolved in 500 mL N-methyl pyrrolidone. The reaction was run for 4 hours then 40.8 g (0.14 mol) of 1,3-bis(3-aminophenoxy)benzene was added and the polymerization was run for 16 hours. For the partial imidization, the solution of polyamic acid was mixed with 100 mL of toluene and was azeotropically distilled for 30 minutes at 156° C. The partially imidized resin was precipitated in deionized water, filtered, and dried at room temperature under air flow. From the titration of the partially imidized solution, the imidization was determined to be 75%. The dry resin was dissolved in NMP to prepare a 52% solution. To 100 g of solution, 4 g of fumed silica (Cab-O-Sil) and 0.5 g of a defoamer (Dow Corning 1400) was mixed well manually and further mixed twice on a three roll mill.

The paste was stencil printed as strips on the release side of a polyethylene terephthalate film (sold by Dupont as "Mylar" which made a rectangular pattern of the LOC adhesive. The adhesive was soft-baked at 80° C. for 15 min. The patterned Mylar film was covered with polyethylene film for storage. To transfer the LOC adhesive on the Mylar across the fingers of an alloy 42 lead frame, the polyethylene film was removed, the patterns on the Mylar film were aligned with the position of the fingers of the lead frame, and the adhesive and lead frame were laminated at 135° C. The Mylar film was removed, leaving an adhesive pattern on the lead frame. The lead frame with the LOC adhesive was baked for 30 min. at 150, 200, and 250° C. After baking the adhesive, dynamic random access memory (DRAM) chips were attached to the lead frame at 320° C. with pressure.

EXAMPLE 2

The adhesive paste prepared in Example 1 was stencil printed on to the release side of Mylar film to make strips of LOC adhesive patterns. The printed patterns were soft-baked at 80° C. for 30 min. The LOC patterns on the Mylar film were aligned with the fingers of a lead frame and laminated at 135° C. The Mylar was removed, leaving the LOC adhesive patterns on the fingers of the circuit substrate. The lead frame was baked for 30 min. at 150, 200, and 250° C. The IC chip was attached to the substrate at 350° C. and the adhesion was good.

EXAMPLE 3

To a 1 liter 3-necked flask, 500 mL NMP, 39 g of BAPP, 4 g of 2,5-dimethyl-1,4-phenylenediamine, and 14 g of 1,3-bis(3-aminopropyl) terminated polydimethyldisiloxane in a 1 to 3 molar ratio of $G_1$ to $G_9$ were dissolved completely. Then 30.3 g of BPDA and 13.75 g of BTDA were added and the polymerization proceeded at room temperature for 10 hours. To the polyamic acid solution, 90 mL of toluene was added and the temperature was raised to 140° C. and kept at that temperature for 2 hours. The resin was precipitated in deionized water, filtered, and dried at room temperature. The imidization was 70%.

The dry resin, 3 g, was dissolved in 6 g NMP and 0.27 g of fumed silica with 0.02 g defoamer was mixed well. The formulated paste was stencil printed as strips onto Mylar film to make LOC adhesive patterns which were soft-baked at 100° C. for 15 min. The LOC adhesive patterns were aligned with the fingers of lead frames and passed through the heating block at 140° C. under gentle pressure. After removing the Mylar film, IC chips were attached to the lead frame at 170° C. with pressure, then baked for 30 min. at 200 and 250° C.

EXAMPLE 4

A single component epoxy resin containing more than 60 wt % powdered silver, sold by Epoxy Technology Inc. as "Epo-tek H35-175MPT," was stencil printed as strips onto the release side of a piece of Mylar film. The resin was partially cured at 165° C. for 20 min. to make the coating non-tacky by soft-baking. The adhesive patterns were aligned with the fingers of a lead frame and were laminated to the lead frame at 130 to 150° C. with a slight pressure. An IC chip was attached at 150° C. and baked at 200° C. for 5 min.

I claim:

1. A method of immobilizing the fingers of circuitry comprising (A) forming a coating of a liquid adhesive in an organic solvent on the surface of a release film in a pattern of strips in positions perpendicular to and across and in between the positions the fingers of said circuitry will have when said pattern of adhesive is bonded thereto;
    (B) rendering said coating non-tacky;
    (C) bonding said strips of coating on said release film across and in between said fingers; and
    (D) removing said release film from said coating.

2. A method according to claim 1 wherein a protective releasable sheet is applied over said coating after step (B) and is removed before step (C).

3. A method according to claim 1 wherein said liquid adhesive is a solution of an adhesive in an organic solvent and said adhesive is rendered non-tacky by heating it above its Tg to evaporate some organic solvent.

4. A method according to claim 1 including the additional last step of hard baking said coating to remove said organic solvent.

5. A method according to claim 1 wherein said bonding in step (C) is performed at a temperature of about 80 to about 150° C. and a pressure of about 6.8 to about 340 kPa.

6. A method according to claim 1 wherein said liquid adhesive comprises a resin selected from the group consisting of an epoxy, a polyamide, a polyimide, a polyamic-acid, a polyamide-imide, a partially imidized polyamic-acid or polyamide-imide, and said resin mixed with a finely divided metal oxide or silica.

7. A method according to claim 1 wherein said adhesive is a paste which comprises a partially imidized polyamic acid, about 40 to about 80 wt % of an organic solvent, and about 0.1 to about 10 wt % of a thixotrope, and about 80 to about 90 wt % of said organic solvent is evaporated in step (B).

8. A method according to claim 7 wherein said pattern is formed by screen printing, stencil printing, or dispensing through a needle.

9. A method according to claim 1 including the additional last step of bonding at least one IC chip to said coating.

10. The method of claim 1, wherein the coating is over and between the fingers of the circuitry.

11. A method of bonding a cluster of integrated circuit chips to a corresponding cluster of lead frames comprising (A) forming a coating of an adhesive which comprises a mixture of an organic solvent and a polyimide, polyamic-acid, polyamide, polyamide-imide, or a partially imidized precursor thereof on the surface of a release film in a pattern corresponding to strips across the fingers of each of said lead frames;
    (B) evaporating a sufficient amount of said organic solvent to render said coating non-tacky;
    (C) aligning said pattern with said cluster of lead frames;
    (D) heating and pressing said release film against said lead frames at a temperature of about 80 to 150 degrees centigrade and a pressure of about 6.8 to about 340 kPa such that said adhesive is forced into spaces between said fingers;
    (E) separating said release film from said adhesive;
    (F) hard baking said adhesive at about 200 to about 400° C. until less than 0.5 wt % solvent remains in said adhesive;
    (G) aligning said cluster of integrated circuit chips with said cluster of lead frames; and
    (H) heating and pressing said cluster of integrated circuit chips against said cluster of lead frames.

12. A method according to claim 11 wherein said adhesive is a paste which comprises a partially imidized polyamic acid about 40 to about 80wt % of an organic solvent, and about 0.1 to about 10 wt % of a thixotrope.

13. A method according to claim 12 wherein said coating is formed by screen or stencil printing or dispensing with a syringe.

14. The method of claim 11, wherein the coating is over and between the fingers of the lead frames.

15. A method of bonding a cluster of integrated circuit chips to a matching cluster of lead frames comprising.

(A) forming a paste which comprises
        (1) a partially imidized polyamic acid;
        (2) about 40 to about 80 wt % of an organic solvent; and
        (3) about 0.1 to about 10 wt % of a thixotrope;
    (B) placing a template on the surface of a release film, said template having aperture therethrough in a pattern of strips in positions perpendicular to and across the position the fingers of said cluster of lead frames will have when said pattern of adhesive is bonded thereto;
    (C) forcing said paste through said apertures onto said release film to form a pattern of said paste on said release film;
    (D) evaporating sufficient solvent from said paste on said release film to render said past non-tacky;
    (E) aligning said pattern of paste on said release film with said cluster of lead frames;
    (F) hot pressing said pattern of paste to said cluster of lead frames at a temperature of about 80 to 150 degrees centigrade and a pressure of about 6.8 to about 340 kPa such that the paste is forced into spaces between said fingers;
    (G) removing said release film from said pattern of paste on said cluster of lead frames;
    (H) hard baking at a temperature sufficient to fully imidize said partially imidized polyamic acid;
    (I) aligning said cluster of lead frames with said cluster of integrated circuit chips; and
    (J) heating and pressing said cluster of integrated circuit chips against said cluster lead frames.

16. A method according to claim 15 wherein said paste is screen or stencil printed onto said release film.

17. A method according to claim 15 wherein said partially imidized polyamic acid is about 10 to about 90% imidized.

18. A method according to claim 15 wherein said organic solvent is N-methylpyrrolidone, dimethylacetamide, or dimethylformamide.

19. A method according to claim 15 wherein said thixotrope if fiuned silica.

20. A method according to claim 15 wherein said partially imidized polyamic acid comprises the reaction product of
(A) a dianhydride selected from the group consisting of oxydiphthalic anhydride, 3,3',4,4'-biphenyl tetracarboxylic dianhydride, 3,3',4,4'-benzophenone tetracarboxylic dianhydride, 2,2-bis(3,4-dicarboxyphenyl) hexafluoropropane dianhydride, and pyromellitic dianhydride; and
(B) a diamine selected from the group consisting of 4,4'-diaminodiphenyl ether, 2,4-diaminotoluene, 1,3-bis(aminophenoxy)benzene, and 2,2-bis(4 [4-aminophenoxy]phenyl)propane.

21. A method according to claim 15 wherein said release film comprises polyethylene terephthalate, polyethylene, polypropylene, or tetrafluoroethylene.

22. A method according to claim 15 wherein said temperature in step (F) is about 80 to about 150° C. and said hard baking in step (H) is at about 200 to about 400° C.

23. The method of claim 15, wherein each of the apertures is positioned over and between the fingers of said cluster of lead frames.

* * * * *

UNITED STATES PATENT AND TRADEMARK OFFICE
CERTIFICATE OF CORRECTION

PATENT NO.    : 6,635,138 B1
DATED         : October 21, 2003
INVENTOR(S)   : Choi It is certified that error appears in the above-identified patent and that said Letters Patent is hereby corrected as shown below:

<u>Column 3,</u>
Line 67, delete "1to" and insert in lieu thereof -- 1 to --;

<u>Column 4,</u>
Line 40, delete "oftriradicals" and insert in lieu thereof -- of triradicals --;

<u>Column 6,</u>
Line 62, delete "oftoluene" and insert in lieu thereof -- of toluene --.

Signed and Sealed this

Thirtieth Day of December, 2003

JAMES E. ROGAN
*Director of the United States Patent and Trademark Office*